United States Patent [19]
Hawke et al.

[11] Patent Number: 5,528,457
[45] Date of Patent: Jun. 18, 1996

[54] METHOD AND STRUCTURE FOR BALANCING ENCAPSULATION STRESSES IN A HYBRID CIRCUIT ASSEMBLY

[75] Inventors: Robert E. Hawke, Burlington; Atin J. Patel, Mississauga, both of Canada

[73] Assignee: Gennum Corporation, Burlington, Canada

[21] Appl. No.: 360,548

[22] Filed: Dec. 21, 1994

[51] Int. Cl.[6] .................................................. H05K 7/20
[52] U.S. Cl. .................. 361/706; 174/16.3; 174/35 R; 174/52.2; 257/706; 257/713; 257/730; 257/787; 361/715; 361/717; 361/816
[58] Field of Search .................. 174/16.3, 35 R, 174/52.2, 52.3; 257/730, 787, 790, 796, 706, 712–713; 361/704–708, 714–722, 816, 818; 437/219

[56] References Cited

U.S. PATENT DOCUMENTS 5,355,016  10/1994  Swirbel et al. .......................... 257/787

FOREIGN PATENT DOCUMENTS

| 0147538 | 7/1986 | Japan | 437/219 |
| 2037752 | 2/1990 | Japan | 257/787 |
| 5063111 | 3/1993 | Japan | 257/730 |

OTHER PUBLICATIONS

IBM Technical Disclosure Bulletin, "Maximum Heat Transfer Medium", Berndlmaier et al, vol. 20, No. 11A, Apr. 1978, pp. 4389–90.

Primary Examiner—Gregory D. Thompson
Attorney, Agent, or Firm—Bereskin & Parr

[57] ABSTRACT

A method and a structure for reducing the stresses arising in a hybrid circuit from the interface between the encapsulant and the substrate. An additional layer, preferably of the same material as the substrate, is added to the outside surface of the encapsulant. The purpose of the layer is to provide a second opposing surface to balance and thereby reduce the stress originating from the encapsulant/substrate interface. The second layer is applied prior to the curing of the encapsulant material.

16 Claims, 1 Drawing Sheet

METHOD AND STRUCTURE FOR BALANCING ENCAPSULATION STRESSES IN A HYBRID CIRCUIT ASSEMBLY

FIELD OF THE INVENTION

This invention relates to electronic hybrid circuits, and more particularly to a method and structure for balancing stresses arising from encapsulation of hybrid circuit assemblies.

BACKGROUND OF THE INVENTION

Hybrid circuit assemblies are known in the art and comprise several separate component parts which are mounted or attached to a substrate. The components are interconnected either by wire bonds, direct solder attachment or electrically conductive epoxy. Once assembled, the circuit is covered with an encapsulant, for example, a known material such as liquid epoxy. The primary purpose of the encapsulant is to isolate and protect the components and bonds from moisture and other contaminants and mechanical shock and corrosion.

The principal drawback of conventional encapsulation processes is the creation of complex stress distributions within the assembly. The stress distributions are a result of the differential shrinkage between the encapsulant and the substrate. These stresses can warp the substrate and result in the eventual delamination of the plastic encapsulant from the substrate surface thereby exposing the hybrid circuit to external contaminants.

Warpage also gives rise to problems associated with the manufacture of hybrid circuits. Warping can reduce the manufacturing yield of circuits. This problem is especially prevalent for larger hybrid circuits where the warpage can affect the ability to mount the circuit on a planar surface, for example, a printed circuit board, therefore necessitating rejection of the warped hybrid assembly. For smaller size hybrid circuits, the effects of warpage are usually not so serious and mainly impact the efficiency of the manufacturing process. Post cure processing also generally requires a relatively planar circuit assembly and thus warpage can affect the manufacturing efficiency for both small and large hybrid circuit assemblies. This problem is further exacerbated by the fact that the resulting warpage is directly proportional to the surface area of the hybrid circuit which is covered by the encapsulant material. Therefore one method of reducing warpage in conventional hybrid circuits involves reducing the area which is encapsulated. While this method can alleviate the effects of warpage, it results in higher unit costs due to reduced surface area utilization and density. It does not solve the root problem.

Other attempts have been made to minimize the stresses which cause warpage. The emphasis in the art has been on the development of "low stress" encapsulant materials. Encapsulant materials, such as the HYSOL™ FP4400 series of encapsulants, have been produced which exhibit shrinkage and thermal coefficients of expansion which are closer to the properties of the material used for the substrate. The aim of such attempts is to reduce warpage by eliminating the resultant differential stresses between the encapsulant and the substrate.

BRIEF SUMMARY OF THE INVENTION

The present invention provides a method and a structure for reducing the stresses arising in a hybrid circuit from the interface between the encapsulant and the substrate.

According to the present invention, an additional layer or lid is added to the outside surface of the encapsulant. The purpose of the layer is to provide a second opposing surface to balance and thereby reduce the stress originating from the encapsulant/substrate interface. The second layer is applied prior to the curing of the encapsulant material.

In a first aspect, the present invention provides a hybrid electronic circuit comprising: (a) a substrate having a surface for receiving one or more electronic components to form an electronic circuit; (b) an encapsulation layer for encapsulating at least a portion of the surface of said substrate and said electronic components, said encapsulation layer forming an interface with said substrate; and (c) a lid mounted on said encapsulation layer for opposing stress arising at said interface between said substrate and said encapsulation layer.

In another aspect, the present invention provides a method for manufacturing a hybrid electronic circuit, said method comprising the steps of: (a) providing a substrate having a first surface and a second surface; (b) attaching one or more electronic components to the first surface of said substrate to form an electronic circuit; (c) applying an encapsulant to at least a portion of the first surface of said substrate and said electronic circuit to form an encapsulation layer; (d) attaching a lid to said encapsulation layer.

BRIEF DESCRIPTION OF THE DRAWINGS

For a better understanding of the present invention, and to show more clearly how it may be carried into effect, reference will now be made, by way of example, to preferred embodiments of the present invention shown in the accompanying drawings in which.

DETAILED DESCRIPTION OF THE PREFERRED EMBODIMENTS

Figure 1:
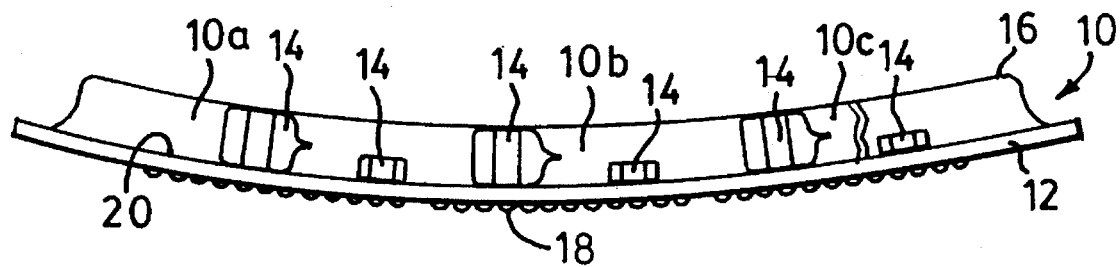
FIG. 1 shows a hybrid circuit array which has been warped by an encapsulant material applied according to the prior art.

Reference is first made to FIG. 1 which shows a hybrid circuit array 10 encapsulated according to the prior art. The hybrid circuit array 10 comprises a substrate 12, electronic components 14, and an encapsulant 16.

The encapsulant 16 is chosen from known compositions such as HYSOL™ FP4400 brand encapsulant available from the Dexter Corporation. Encapsulants such as the HYSOL™ FP4400 series comprise a liquid epoxy which includes electronic grade silica. The substrate 12 can be fabricated from 96% alumina ($Al_2O_3$) or other suitable materials as will be within the understanding of those skilled in the art.

The coefficient of linear thermal expansion for HYSOL™ brand encapsulant is 20 to 23 (inches/inches/degrees Centigrade), while that for a typical alumina substrate is 7 to 9.

The electronic components 14 can include capacitors (dielectric layers), resistors (e.g. thick or thin film), and semiconductor microchips which are fabricated and mounted on the top surface of the substrate 12 using known techniques. As shown in FIG. 1, the bottom surface of the substrate 12 includes solder pads denoted generally by reference 18. The bottom surface of the substrate 12 may also be populated with components similar to the top surface. The solder pads 18 are for connecting the hybrid circuit 10 to other circuit elements, for example, a printed circuit board or PCB (not shown) or other components with attached wires.

As shown in FIG. 1, the hybrid circuit array 10 comprises multiple hybrid circuits or "cells" denoted by references 10a, 10b and 10c which are fabricated on the substrate 12. The individual hybrid circuits or cells 10a, 10b, 10c are separated by cutting or sawing at the locations shown in FIG. 1. The separated hybrid cells 10a, 10b, 10c are also known as "singulated hybrid circuits" in the art.

The hybrid circuit 10 in FIG. 1 shows diagrammatically the warpage which results from the differential stresses arising at the interface between the substrate 12 and the encapsulant 15. In FIG. 1, the encapsulant/substrate interface is denoted generally by 20. The encapsulant 16 cures, i.e. dries, to a rigid form. The warpage results from the shrinkage which the encapsulant 16 experiences as it cures. The shrinkage, in turn, causes a differential stress along the interface 20 which cause the substrate 12 and encapsulant 16 to warp or bend as shown in FIG. 1.

Figure 2:
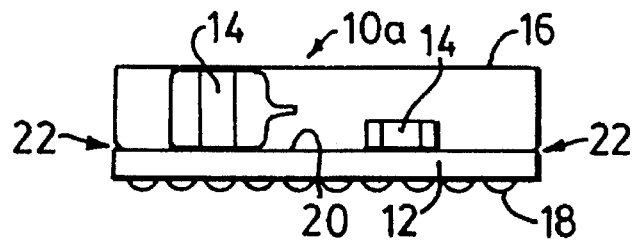
FIG. 2 shows a sectional view of a singulated hybrid circuit of FIG. 1 showing delamination resulting from encapsulation according to the prior art.

Reference is next made to FIG. 2 which shows the hybrid cell 10a in more detail. The hybrid cell 10a shown in FIG. 2 exhibits delamination or "peeling" at the encapsulant/substrate interface 20. The delamination is denoted by reference 22. Delamination 22 as will be understood is caused by the differential stresses resulting from the shrinkage of the encapsulant 16. The incidence of delamination will vary due to a number of factors which include the following. The encapsulation composition which can vary from batch to batch. The layout of the hybrid cell 10a can also affect delamination. For example, the proximity of components 14 to the edge of the hybrid cell 10a can accentuate the incidence of delamination. In addition, the density of the components 14 and the area utilization of the substrate 12 can also affect delamination. The curing schedule or rate utilized for the encapsulant 16 is also a factor. From a manufacturing stand point, a rapid cure cycle is preferred, but this induces higher stresses at the encapsulant/substrate interface 20. Another factor is the nature of the components 14 to be encapsulated. In thick film hybrid circuits, the final component layer can include a number of different materials from metals (gold, palladium, silver, platinum silver, copper, solder, etc.) to resistive inks, alumina or dielectric layers (e.g. glass). Furthermore, delamination has been found to occur over a wide range of encapsulant thicknesses, e.g. from 0.035 inches to 0.065 inches.

Figure 3:
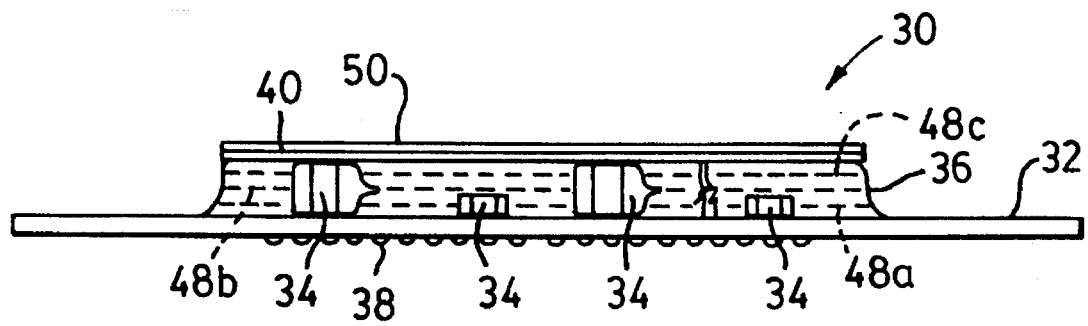
FIG. 3 is side view of a hybrid circuit which has been encapsulated according to the present invention.

Reference is next made to FIG. 3 which shows a hybrid circuit assembly according to the present invention and denoted generally by reference 30. The hybrid circuit 30 comprises a conventional substrate 32 and components 34 which are mounted on the surface of the substrate 32. A layer of encapsulant 36 covers the components 34 and surface of the substrate 32. The hybrid circuit 30 also includes solder pads 38 on the bottom surface of the substrate 32.

As shown in FIG. 3, the hybrid circuit 30 according to the present invention includes a lid 40. The lid 40 is an additional layer which is added to the top of the encapsulant 36. The lid 40 forms a permanent part of the assembly for the hybrid circuit 30. According to the invention, the lid 40 forms an outer layer which produces an opposing surface to effectively balance the stress at the original encapsulant/interface and thereby reduce the warpage or bending moment which occurs in a conventional hybrid circuit 10 (FIG. 1).

Preferably, the lid 40 is formed from the same material as the substrate 32, e.g. 96% alumina, and added to the hybrid circuit 30 before the encapsulant 36 has cured. Preferably, the material for the lid 40 has the same thermal coefficient of expansion as the material for the substrate 32. It will be appreciated that generally the substrate 32 has a lower thermal coefficient of expansion or CTE than the encapsulant 36. This results in the substrate 32 being in compression. Therefore, it is also desirable that the lid 40 be strong in compression.

The lid 40 can have a range of thicknesses which will depend in part on the compressive strength of the material used. For an alumina substrate 32 having a thickness of 0.020 inches and measuring 3×3 inches in area, a suitable thickness for the lid 40 is in the range 0.010 to 0.020 inches. Since the lid 40 and substrate 32 are in compression, the primary factor is the compressive strength of the material used.

Figure 4:
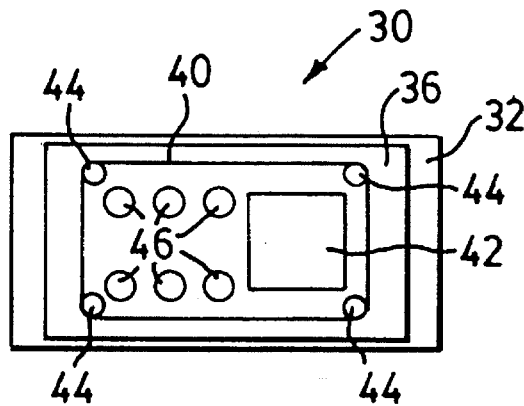
FIG. 4 is a top view of another embodiment of the hybrid circuit shown in FIG. 3.

In another aspect, the lid 40 provides a planar marking surface 42 (FIG. 4) on the encapsulant 36 which can be used for marking or identifying the circuit, e.g. part number and batch information. The planar surface 42 also facilitates pick-up by vacuum collets to enable automatic placement, for example, in a surface mount application. In addition, the lid 40 can provide a larger planar surface which can be used as a flat mounting face for inverted mounting of the circuit 30 using, for example, mounting holes indicated by reference 44.

In another aspect, the lid 40 can provide a heat dissipation function. It will be appreciated that this feature is desirable for high power hybrid circuits. The lid 40 can be fabricated from a thermally conductive material, which of course, meets the compression strength characteristics, as discussed above. In another variation, the lid 40 can include suitable thermal vias 46 (FIG. 4) through the lid 40 alone or in combination with a conductive coating material applied to the lid 40. Examples of such materials are copper and silver alloys. The coating is indicated in broken lines at 50 at FIG. 3.

In yet another aspect, the lid 40 can be coated with a Radio Frequency (RF or IR) shielding material, e.g. copper, etc. This may be desirable in certain circuit applications, since a standard encapsulant 36 does not possess RF shielding characteristics. Again the coating may be applied as indicated by coating 50 in FIG. 3.

In another aspect, the encapsulant layer 36 can be formed from multiple thin layers 48a, 48b, 48c (as shown in broken lines in FIG. 3) with each layer, e.g. 48a, being snap cured or "gelled" before the next layer, e.g. 48c, is applied. A lid 40 according to the invention can then be attached prior to the last layer, e.g. 48c, of encapsulant being gelled. It will be appreciated that the multiple thin layers 48a to 48c of encapsulant result in smaller bending moments which are then opposed by the attached lid 40.

The present invention may be embodied in other specific forms without departing from the spirit or essential characteristics thereof. Thus, the presently disclosed embodiments are to be considered in all respects as illustrative and not restrictive, the scope of the invention being indicated by the appended claims rather than the foregoing description, and all changes which come within the meaning and range of equivalency of the claims are therefore intended to be embraced therein.

We claim:

1. A hybrid electronic circuit comprising:
   (a) a substrate of a selected class of material and having a lower surface and an upper surface, and a plurality of electronic components mounted directly on said upper surface with spaces between said components, to form an electronic circuit, said lower surface being exposed to the atmosphere;
   (b) an encapsulation layer for encapsulating at least a portion of said upper surface of said substrate and said electronic components, said encapsulation layer extending through said spaces and forming an interface with said upper surface of said substrate, said encapsulation layer having an upper surface; and
   (c) a lid mounted on said upper surface of said encapsulation layer for opposing bending stress arising at said interface between said substrate and said encapsulation layer, said lid being formed from material of the same class as that of said substrate and covering the entire upper surface of said encapsulation layer.

2. The hybrid electronic circuit as claimed in claim 1, wherein said lid and said substrate have the same coefficient of thermal expansion.

3. The hybrid electronic circuit as claimed in claim 2, wherein said class of material comprises 96% alumina.

4. The hybrid electronic circuit as claimed in claim 1, wherein said lid includes shielding means for radio frequency shielding of the electronic circuit.

5. The hybrid electronic circuit as claimed in claim 1, wherein said lid includes heat dissipation means for dissipating heat generated by the electronic circuit.

6. The hybrid electronic circuit as claimed in claim 5, wherein said heat dissipation means comprises a heat conductive coating applied to said lid.

7. The hybrid electronic circuit as claimed in claim 5, wherein said heat dissipation means comprises thermal vias formed in said lid.

8. A method for manufacturing a hybrid,electronic circuit, said method comprising the steps of:
   (a) providing a substrate of a selected class of material, said substrate having a lower surface and an upper surface;
   (b) attaching a plurality of electronic components directly to the upper surface of said substrate with spaces between said components, to form an electronic circuit, said lower surface of said substrate being exposed to the atmosphere;
   (c) applying an encapsulant to at least a portion of the first surface of said substrate and said electronic circuit to form an encapsulation layer, said encapsulation layer extending through said spaces and forming an interface with said first surface of said substrate, said encapsulation layer having an upper surface;
   (d) attaching a lid to said encapsulation layer for opposing bending stress arising at said interface between said substrate and said encapsulation layer, said lid being of the same class of material as that of said substrate and covering the entire upper surface of said encapsulation layer;
   (e) and after attaching said lid, curing said encapsulant.

9. The method as claimed in claim 8, wherein after said step of attaching a lid is performed, said encapsulant is cured.

10. The hybrid electronic circuit as claimed in claim 1, 2, 4 or 5, wherein said lid includes mounting means for mounting the hybrid electronic circuit using said lid.

11. The hybrid electronic circuit as claimed in claim 1 or 2, wherein said lid includes means for identifying the electronic circuit.

12. The hybrid electronic circuit as claimed in claim 1 or 2, wherein the plurality of electronic components comprises a plurality of discrete passive components and a plurality of discrete active components, which are spaced apart from one another.

13. The hybrid electronic circuit as claimed in claim 1 or 2, which comprises a plurality of individual, substantially similar electronic circuits, which are separate from one another, the hybrid electronic circuits being intended to be cut into individual discrete electronic circuits.

14. A method is claimed in claim 9, wherein the electronic components attached in step (b) comprise a plurality of passive components and a plurality of active components, which are attached in step (b) so as to be spaced apart from one another.

15. A method is claimed in claim 9 or 14, wherein the hybrid electric circuit comprises a plurality of substantially identical, discrete electronic circuits which are separate from one another, and wherein the method includes the following additional step:
   (e) after curing the encapsulant, cutting the hybrid electronic circuit into individual discrete electronic circuits.

16. A method is claimed in claim 15, wherein the individual discrete electronic circuits are arranged in cells in an array, which are separated from one another in step (e) by cutting, with the individual circuits having side faces perpendicular to the lower and upper surfaces.

* * * * *